United States Patent [19]
Hill

[11] Patent Number: 5,917,771
[45] Date of Patent: Jun. 29, 1999

[54] REGISTER BANK BIT LINES

[75] Inventor: Stephen John Hill, Austin, Tex.

[73] Assignee: Arm Limited, Cambridge, United Kingdom

[21] Appl. No.: 08/962,833

[22] Filed: Nov. 3, 1997

[51] Int. Cl.$^6$ .................................................. G11C 8/00
[52] U.S. Cl. ................ 365/230.03; 365/227; 365/185.25
[58] Field of Search ............................... 365/230.03, 227, 365/185.25

[56] References Cited

U.S. PATENT DOCUMENTS

| | | | |
|---|---|---|---|
| 4,810,910 | 3/1989 | Schoellikopf et al. ................. | 365/203 |
| 5,748,551 | 5/1998 | Ryan et al. ......................... | 365/230.03 |
| 5,815,457 | 9/1998 | Pascucci ............................. | 365/230.03 |
| 5,822,268 | 10/1998 | Kirihata ............................. | 365/230.03 |
| 5,841,727 | 11/1998 | Iwanari et al. ...................... | 365/230.03 |

*Primary Examiner*—David Nelms
*Assistant Examiner*—Tuan T. Nguyen
*Attorney, Agent, or Firm*—Nixon & Vanderhye P.C.

[57] ABSTRACT

A data processing apparatus is provided comprising a processor core for performing processing operations, and a register bank comprising a plurality of registers for storing data values used by the processor core, the register bank having first and second portions such that in preferred embodiments the first portion of the register bank may be arranged to include the more frequently accessed registers. Each register in the register bank comprises a plurality of memory cells for storing data bits, and the register bank has a bit line associated with corresponding memory cells from a number of said registers, each memory cell being arranged, upon receipt of a command, to selectively alter the associated bit line from a first state to a second state dependent on the data bit stored in that memory cell.

In accordance with the present invention, a separation circuit is provided to separate the bit line into first and second parts, the first part being associated with memory cells of registers in the first portion of the register bank and being coupled to an output of the register bank, and the second part being associated with memory cells of registers in the second portion of the register bank. The separation circuit is responsive to a memory cell of a register in the second portion of the register bank altering the second part of the bit line to said second state, to cause the first part of the bit line to be altered to said second state, whereas if a memory cell of a register in the first portion of the register bank alters the first part of the bit line to said second state, the separation circuit is arranged to maintain the second part of the bit line in the first state.

By this approach, the power consumption required to operate the register bank is reduced since when reading the registers in the first portion of the register bank, only part of the bit line has to be discharged. If the first portion of the register bank is arranged to include the most frequently accessed registers, then significant power savings can be realized.

16 Claims, 6 Drawing Sheets

| | MODE | | | | | |
|---|---|---|---|---|---|---|
| USER/SYSTEM | SUPERVISOR | ABORT | UNDEFINED | INTERRUPT | FAST INTERRUPT |
| R0 | R0 | R0 | R0 | R0 | R0 |
| R1 | R1 | R1 | R1 | R1 | R1 |
| R2 | R2 | R2 | R2 | R2 | R2 |
| R3 | R3 | R3 | R3 | R3 | R3 |
| R4 | R4 | R4 | R4 | R4 | R4 |
| R5 | R5 | R5 | R5 | R5 | R5 |
| R6 | R6 | R6 | R6 | R6 | R6 |
| R7 | R7 | R7 | R7 | R7 | R7 |
| R8 | R8 | R8 | R8 | R8 | R8_FIQ |
| R9 | R9 | R9 | R9 | R9 | R9_FIQ |
| R10 | R10 | R10 | R10 | R10 | R10_FIQ |
| R11 | R11 | R11 | R11 | R11 | R11_FIQ |
| R12 | R12 | R12 | R12 | R12 | R12_FIQ |
| R13 | R13_SVC | R13_ABORT | R13_UNDEF | R13_IRQ | R13_FIQ |
| R14 | R14_SVC | R14_ABORT | R14_UNDEF | R14_IRQ | R14_FIQ |

FIG. 5

REGISTER BANK BIT LINES

BACKGROUND OF THE INVENTION

1. Field of the Invention

The present invention relates to data processing apparatus having register banks with bit lines for reading the contents of the register bank.

2. Description of the Prior Art

A typical data processing apparatus includes a processor core having a register bank comprising a plurality of registers, the registers being used to store data values used by the processor core.

In a typical register bank, there will be an array of static memory elements or cells, each static memory cell being arranged to store a data bit. An individual register within the register bank typically consists of a plurality of such static memory cells, which are usually arranged in a row. The data bits stored by that row of static memory cells then represent the data value stored by that register. Hence, taking the example of a register bank containing 32 bit registers, each register will consist of 32 static memory cells.

It will be appreciated that the actual data value stored in a register may be an item of data to which the processor core can apply processing instructions, or may indeed be an instruction to be executed by the processor core. Hence, for the purposes of the present application, the term "data value" refers to both data and instructions that may be stored within the registers of the register bank.

To read the data value stored by a register, each register is provided with a word line to which each memory cell forming that register is connected. A read signal is then provided to those memory cells via the word line when it is desired to read the contents of the register.

Further, each memory cell is connected to an associated bit line such that corresponding memory cells in each register are connected to the same bit line, with the memory cells of any particular register being connected to different bit lines. Prior to a register read process taking place, each bit line is typically precharged to a predetermined voltage. Then, when the read signal is provided over the word line of a particular register, each memory cell of that register is arranged to selectively discharge its associated bit line dependent on the value of the data bit stored by that register. The outputs of the bit lines associated with each memory cell of the register then provide an indication of the data value stored by that register.

To improve the processing speed of the processor core, it is desirable to reduce the frequency with which data values have to be moved back and forth between the register bank and cache or main memory. This can be achieved by increasing the number of registers within the register bank, so that more data values can be retained in the register bank.

However, this clearly increases the size of the register bank, and hence increases the length of the bit lines which are connected to corresponding memory cells of the registers in the register bank. This increases the capacitance of the bit line, and hence increases the power that must be consumed by the memory cells in order to discharge those bit lines during a register read operation, and then be used subsequently to precharge the bit lines following the register read.

Generally in the field of data processing, it is desirable to reduce the power consumption wherever possible, since as the power consumption increases, so typically the heat generated by the data processing circuit increases, and this then requires appropriate heat dissipation provisions to be made.

A further consideration is that such data processing apparatus are commonly used in battery-operated devices, such as laptop computers, portable telephones, personal organisers, etc. Clearly in such instances, power consumption is a very important issue, since the operating life of the device (i.e. the time between replacing or recharging the batteries) is increased as the power consumption is reduced, and a device that has an improved operating life over competing devices is generally more attractive to the consumer.

Hence, it is an object of the present invention to provide a data processing apparatus and method which reduces the power consumption associated with charging and discharging bit lines in a register bank.

SUMMARY OF THE INVENTION

Accordingly, the present invention provides a data processing apparatus, comprising: a processor core for performing processing operations; a register bank comprising a plurality of registers for storing data values used by the processor core, the register bank having first and second portions; each register in the register bank comprising a plurality of memory cells for storing data bits, and the register bank having a bit line associated with corresponding memory cells from a number of said registers; each memory cell being arranged, upon receipt of a command, to selectively alter the associated bit line from a first state to a second state dependent on the data bit stored in that memory cell; a separation circuit being provided to separate the bit line into first and second parts, the first part being associated with memory cells of registers in the first portion of the register bank and being coupled to an output of the register bank, and the second part being associated with memory cells of registers in the second portion of the register bank; the separation circuit being responsive to a memory cell of a register in the second portion of the register bank altering the second part of the bit line to said second state, to cause the first part of the bit line to be altered to said second state, whereas if a memory cell of a register in the first portion of the register bank alters the first part of the bit line to said second state, the separation circuit is arranged to maintain the second part of the bit line in the first state.

In accordance with the present invention, the register bank has two portions such that a first portion can be arranged in preferred embodiments to contain the more frequently accessed registers. A separation circuit is then used to separate a bit line in to two parts, the first part being coupled to an output of the register bank. Further, the first part of the bit line is associated with corresponding memory cells of the registers in the first region of the register bank, and the second part is associated with corresponding memory cells of the registers in the second region of the register bank. The separation circuit is then operable in preferred embodiments to prevent the second part of the bit line from being discharged when the first part of the bit line is discharged, whilst ensuring that the first part of the bit line is discharged if the second part is discharged. By this approach, any discharging of the bit line will always be observed at the output of the register bank, but the entire bit line is only discharged when registers in said second region are accessed.

Hence, assuming the most frequently accessed registers are arranged to be in the first region of the register bank, they can be read by only discharging the first part of the bit line. Since the first part of the bit line will have less capacitance than the entire bit line, the memory cells will dissipate less power to discharge it, and further less power will be dissipated to precharge the first part of the bit line again following the register read process. By ensuring that the most frequently accessed registers are provided within the first region, significant power savings can be realised.

Further, registers lend themselves to this kind of arrangement. The instructions executed by the processor core can be written such that the most frequently executed instructions manipulate data values in a certain predefined subset of the registers, for example the first X registers of a register bank containing Y registers (where Y>X), this subset then being provided in the first region of the register bank.

Additionally, for a register bank having Y registers, it should be noted that the arrangement of the present invention can be realised without significantly increasing the size of the register bank as compared with a prior art register bank having Y registers. This is advantageous since increasing the size increases the area of silicon that is required to produce the register bank and hence tends to increase the cost.

Further, since the first part of the bit line has less capacitance than the entire bit line, a memory cell can discharge the first part of the bit line more quickly, and hence the content of registers in the first portion of the register bank can be observed more quickly. Typically, the register read process will be clocked based on the time taken to read a register in the worst case scenario, i.e. a register in the second portion of the register bank. However, if asynchronous circuit techniques, different numbers of clock cycles, or different clock speeds, were used dependent on the location of the registers being accessed, then the arrangement of the present invention can be used to increase the speed of the data processing apparatus. For example, if all registers used in one mode of operation are in the first portion of the register bank, then the data processing speed can be increased in that mode of operation due to the increased speed with which the data values can be read from the register bank.

In preferred embodiments, the separation circuit is controlled directly by the state of the second part of the bit line. In such cases, if the second part of the bit line is altered to said second state, the separation circuit is preferably arranged to respond by driving the first part of the bit line to the second state.

As an alternative to controlling the separation circuit directly by the state of the second part of the bit line, the apparatus can be arranged such that when a memory cell of a register in the second portion of the register bank is accessed, the separation circuit is arranged to receive a control signal to connect the first and second parts of the bit line. Hence, in this alternative embodiment, the data processing apparatus may be arranged to determine that a register in the second portion of the register bank is being accessed and to then activate the separation circuit to connect the first and second part of the bit line. This may occur before the relevant memory cell has even started to discharge the bit line. Then, if the memory cell does discharge the bit line, it will discharge the entire bit line directly.

The decision as to which registers to place in the first and second portions of the register bank can be made dependent on a number of factors. However, in preferred embodiments, the first portion of the register bank is arranged to include the more frequently accessed registers, since this arrangement tends to yield the greatest power savings.

In preferred embodiments, the processor core has a normal mode of operation and at least one other mode of operation, and the register bank is arranged such that registers arranged to store data values used only in said at least one other mode of operation are provided in the second portion. Hence, when said processor is operating in said at least one other mode of operation, it may access a register which requires the entire bit line to be discharged, the associated memory cell of that register discharging the second part of the bit line and in preferred embodiments the separation circuit then causing the first part of the bit line to be discharged. In such cases, the power consumed is likely to be comparable to the power that would have been consumed had the bit line not been separated, and hence the entire bit line had been discharged by the memory cell.

However, the majority of the time, the data processing apparatus will be in the normal mode of operation and hence will access registers in the first portion of the register bank, power savings being obtained each time such a register is accessed. Further, even in the at least one other mode of operation, the data processing apparatus may still read data values from registers in the first portion of the register bank, and hence overall power savings can be realised even in such other modes of operation.

The separation logic may be formed from any suitable components that achieve the desired operation of the separation logic. However, in preferred embodiments, the separation logic includes an n-type transistor arranged to alter the state of the first part of the bit line to the second state in response to the second part of the bit line being altered to the second state. The source of the n-type transistor is preferably connected to earth, and the drain of the n-type transistor is then preferably connected to the first part of the bit line. Additionally, in preferred embodiments, the separation logic further comprises an inverter having its input connected to the second part of the bit line, and its output connected to the gate of the n-type transistor.

As an alternative to the above combination of inverter and n-type transistor, a p-type transistor or a diode could be used to separate the two parts of the bit line. However, an n-type transistor is more effective at discharging the first part of the bit line to earth when activated by the signal from the inverter and hence is used in preferred embodiments in preference to either of the above alternatives.

Further, in alternative embodiments where the separation circuit is controlled by a separate control signal rather than directly by the state of the second part of the bit line, the separation logic may be formed from a switch which separates the two parts of the bit line in one position, and connects the two parts of the bit line together in the other position on receipt of the command signal.

In preferred embodiments, the first and second parts of the bit line each have a precharging circuit for precharging the bit line to the first state prior to the issuance of said command to a memory cell, the memory cell being arranged, upon receipt of said command, to selectively discharge the associated bit line from the first state to the second state dependent on the data bit stored in that memory cell. Preferably each said precharging circuit comprises a transistor with its source connected to the bit line, and its drain connected to a reference voltage, whereby, upon receipt of a precharge signal at the gate of the transistor, the transistor is arranged to precharge the bit line to the first state.

The precharge signal could be applied continuously such that the transistor is always trying to precharge the bit line. In such cases, a weak transistor would preferably be used, so that the memory cells can discharge the bit line despite the presence of the precharging circuit. However, in preferred embodiments, the precharge signal is only passed to the transistor when said command is not being passed to a memory cell associated with the bit line.

In preferred embodiments, the first part of the bit line is coupled to the output of the register bank via a sensing circuit, the sensing circuit being arranged to identify the occurrence of a memory cell discharging the bit line from the first state. By using a sensing circuit, it is generally not necessary for the bit line to be completely discharged before the change in state is detected, and hence this improves the speed of the reading operation.

The sensing circuit may be provided by a sense amplifier or the like. However, in preferred embodiments, for simplicity, the sensing circuit is an inverter which outputs a logic '0' value when the first part of the bit line is in the pre-charged state, but alters its output to a logic '1' level when the voltage on the first part of the bit line drops below a predetermined level during discharging of the bit line by an associated memory cell.

Preferably the command used to initiate the read process is received by a memory cell via a word line, a word line being provided for each register, and being arranged to issue the command to each memory cell in that register, thereby causing each memory cell of that register to selectively alter the bit line associated with that memory cell from the first state to the second state dependent on the data bit stored in that memory cell, thereby providing an indication of the data value stored in that register.

In the above discussion of the invention, the register bank is divided in to two portions, with a separation circuit used to separate the bit line into two parts, one corresponding to each register bank portion. However, the invention is not limited to such an arrangement, and hence in alternative embodiments, the register bank may have one or more further portions, the data processing apparatus then further comprising one or more further separation circuits to separate the bit line in to one or more further parts, such that each region of the register bank has an associated part of the bit line.

Viewed from a second aspect, the present invention provides a method of operating a data processing circuit, comprising the steps of: (a) performing processing operations; (b) providing a register bank comprising a plurality of registers for storing data values used at said step (a), the register bank having first and second portions, each register in the register bank comprising a plurality of memory cells for storing data bits, and the register bank having a bit line associated with corresponding memory cells from a number of said registers; (c) upon receipt of a command by a memory cell, causing that memory cell to selectively alter the associated bit line from a first state to a second state dependent on the data bit stored in that memory cell; (d) providing a separation circuit to separate the bit line into first and second parts, the first part being associated with memory cells of registers in the first portion of the register bank and being coupled to an output of the register bank, and the second part being associated with memory cells of registers in the second portion of the register bank; (e) responsive to a memory cell of a register in the second portion of the register bank altering the second part of the bit line to said second state, employing said separation circuit to cause the first part of the bit line to be altered to said second state; and (f) responsive to a memory cell of a register in the first portion of the register bank altering the first part of the bit line to said second state, employing said separation circuit to maintain the second part of the bit line in the first state.

BRIEF DESCRIPTION OF THE DRAWINGS

The present invention will be described, further by way of example only, with reference to a preferred embodiment thereof as illustrated in the accompanying drawings, in which:

FIG. 5 illustrates the registers used in different modes of operation of the processor core in accordance with preferred embodiments of the present invention.

DESCRIPTION OF A PREFERRED EMBODIMENT

Figure 1:
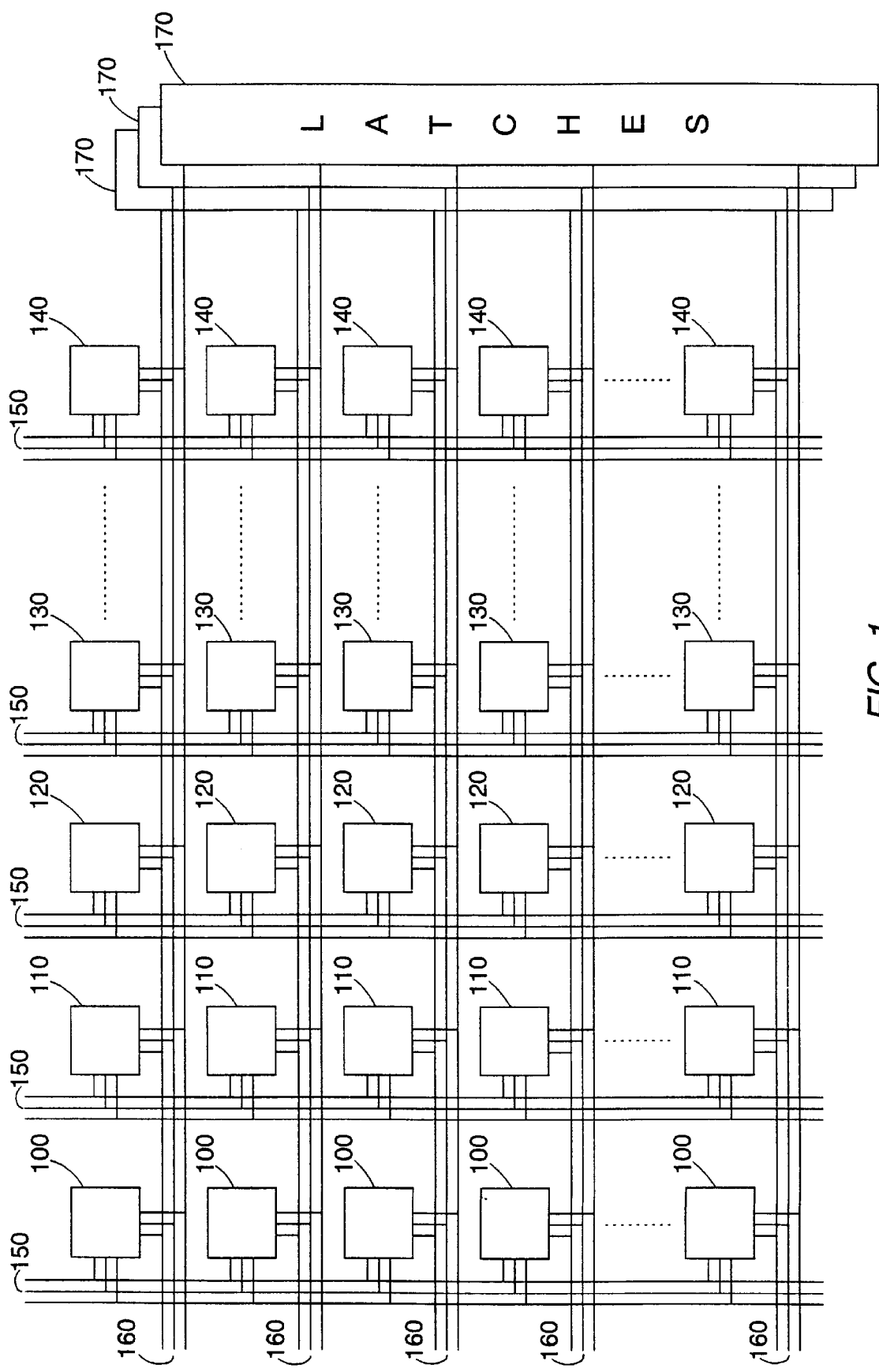
FIG. 1 is a diagram illustrating the arrangement of a register bank in accordance with preferred embodiments of the present invention.

FIG. 1 illustrates a register bank used in a data processing apparatus in accordance with preferred embodiments of the present invention. The register bank comprises an array of static memory cells 100, 110, 120, 130 and 140. An individual register in the register bank will consist of a plurality of such memory cells, for example 32 memory cells for a 32 bit register. Hence, a first register consists of the memory cells 100, a second register consists of the memory cells 110, a third register consists of the memory cells 120, etc. Although different reference numerals have been used in FIG. 1 for the memory cells 100, 110, 120, 130 and 140, this is purely to illustrate how the memory cells are grouped into registers, and all of the memory cells have the same structure in preferred embodiments of the present invention.

For each register in the register bank, word lines 150 are provided to which each memory cell forming that register are connected. In preferred embodiments, each register has three word lines 150, but three word lines are not essential and indeed any number of word lines may be provided for each register. To read the data value stored by a register, a read signal is provided to the memory cells forming that register via one of that register's word lines 150.

Corresponding memory cells in each register are connected to one or more bit lines 160, in preferred embodiments each memory cell being connected to three bit lines. Hence, as illustrated in FIG. 1, the memory cells of any particular register, for example the memory cells 100 of the first register, are connected to different bit lines.

Each bit line 160 is precharged to a predetermined voltage prior to a read process from the register bank taking place. Then, when a read signal is provided to the memory cells of a particular register via one of that register's word lines 150, each memory cell of that register is arranged to selectively discharge the associated bit line 160 dependent on the data bit stored within that memory cell. The voltage on each bit line then indicates the data bit stored in the memory cell associated with that bit line, and this voltage is sensed to determine the data bit. The data bits thus determined are then in preferred embodiments stored in latches 170 for subsequent use by the processor core of the data processing apparatus.

Each word line is associated with a particular bit line. Hence, if a read signal is issued on word line 1, then the memory cells activated by the word line will selectively discharge bit line 1 dependent on the value of the data bit stored in each memory cell. Thus, by providing three word lines and three corresponding bit lines, the contents of three registers can be simultaneously read from the register bank. Three separate sets of latches 170 are then provided to store the contents of the three registers as determined from the voltage levels of the corresponding bit lines.

Figure 2:
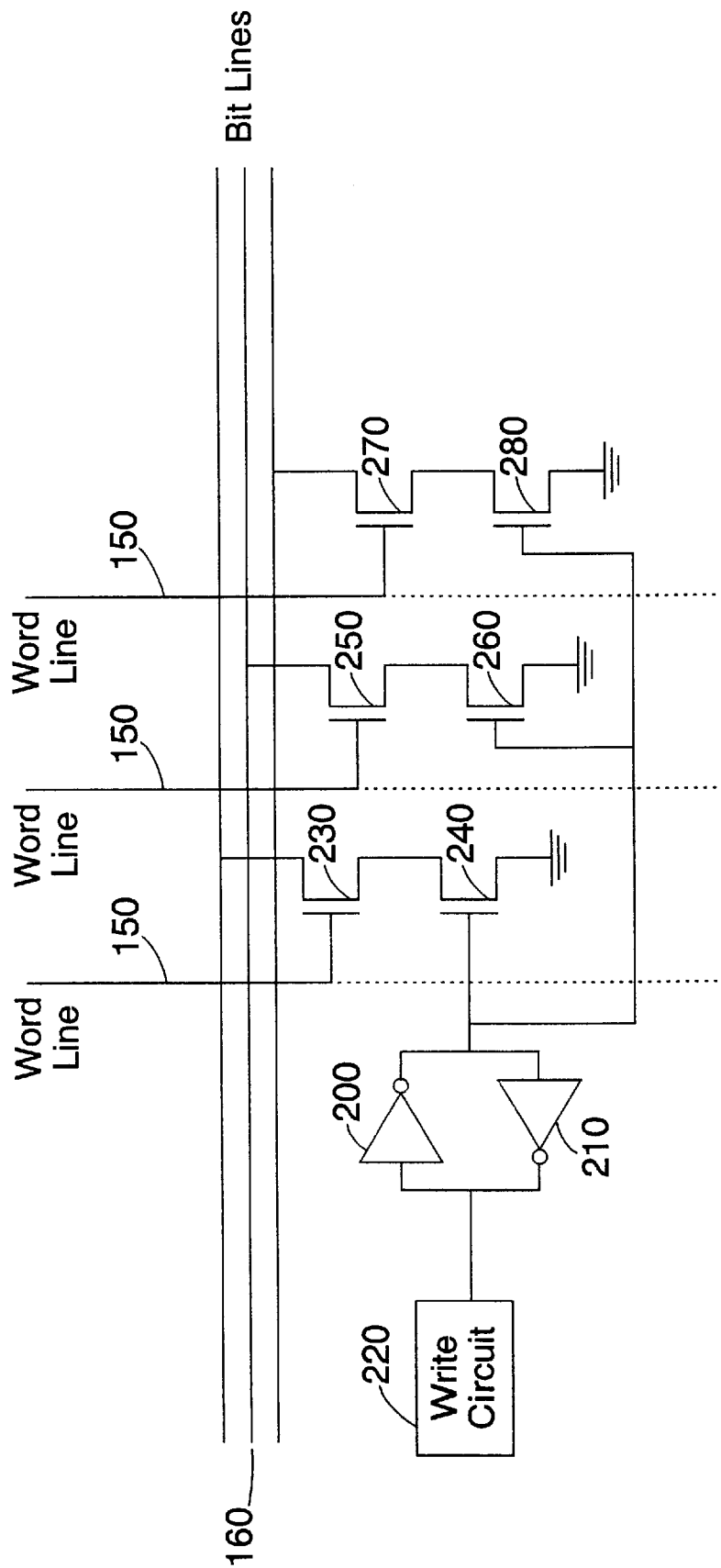
FIG. 2 provides a more detailed illustration of a memory cell of the register bank illustrated in FIG. 1.

FIG. 2 provides a more detailed illustration of a memory cell 100, 110, 120, 130, 140 as used in the register bank of FIG. 1 in preferred embodiments. Within the memory cell, two inverters 200, 210 are provided to store the data bit, the output of one inverter being connected to the input of the other inverter as illustrated in FIG. 2. A write circuit 220 is then connected to the input of inverter 200 and to the output of inverter 210. To store a logic 1 value, a logic 0 value is output by the write circuit 220, the write circuit being able to flip the state of the inverters 200, 210. Hence, the logic 0 value output by the writing circuit 220 will cause the inverter 200 to output a logic 1 value which will then cause the inverter 210 to output a logic 0 value. At this point, the inverter circuit 200, 210 will be stable, a logic 1 value will be present between the output of the inverter 200 and the input of the inverter 210, and hence the write circuit 220 can remove its output signal. To alter the data bit stored to a logic 0 value, the write circuit 220 will output a logic 1 value to flip the state of the inverter circuit 200, 210, so as to cause a logic 0 value to be present between the output of the inverter 200 and the input of the inverter 210.

To read the value of the data bit stored in the memory cell, a voltage is applied to one of the word lines 150 to turn on corresponding first transistors 230, 250, 270. In preferred embodiments, the first transistors 230, 250, 270 are n-type transistors, each transistor being associated with a particular word line and a corresponding bit line. Each transistor has its drain connected to its associated bit line, and its gate connected to its associated word line. Further, the source of each transistor 230, 250, 270, is connected to the drain of a corresponding second transistor 240, 260, 280, the source of each second transistor being connected to earth. Additionally, in preferred embodiments, the second transistors are also n-type transistors, and the gate of each second transistor 240, 260, 280 is connected to the output of the inverter 200.

Thus, assuming each bit line 160 is precharged to a predetermined voltage prior to the memory cell being read, then that bit line will be discharged only if both the associated first and second transistors are turned on, thereby earthing that bit line. The first transistor 230, 250, 270 is turned on if the associated word line 150 issues a read signal. However, the corresponding second transistor 240, 260, 280 will only be turned on if the output of the inverter 200 is at a logic 1 level, and hence the bit line will only be discharged if the memory cell is storing a logic 1 value. If the memory cell is storing a logic 0 value, then the second transistors 240, 260, 280 will not be turned on and hence the corresponding bit lines 160 will remain in the precharged state.

The voltage on the bit line is then sensed, and the value of the data bit stored in the memory cell determined from that voltage.

The arrangement illustrated in FIG. 2 is intended for use with bit lines which are precharged to a predetermined voltage (Vdd) and then subsequently discharged by an associated memory cell if that memory cell is storing a logic 1 value. However, it will be appreciated by those skilled in the art that the bit lines could instead be precharged to zero voltage, and subsequently charged to a predetermined voltage by an associated memory cell dependent on the data bit stored within that memory cell. Further, in either of the above embodiments, it will be clear that, by use of appropriate circuitry such as an inverter, the state of the bit line could be altered by the memory cell if that memory cell is storing a logic 0 value rather than a logic 1 value.

Additionally, it should be noted that, for the purposes of the present invention, the memory cell need not have the structure illustrated in FIG. 2, the exact structure of the RAM cell being a matter of design choice.

Having described the structure of a memory cell in accordance with preferred embodiments of the present invention, the separation circuit used to partition a bit line in accordance with preferred embodiments of the present invention will now be described with reference to FIG. 3. To reduce complexity, each memory cell is illustrated as being connected to only one word line 150 and one bit line 160, although it will be appreciated that in preferred embodiments each memory cell will be connected to three word lines and three corresponding bit lines.

Figure 3:
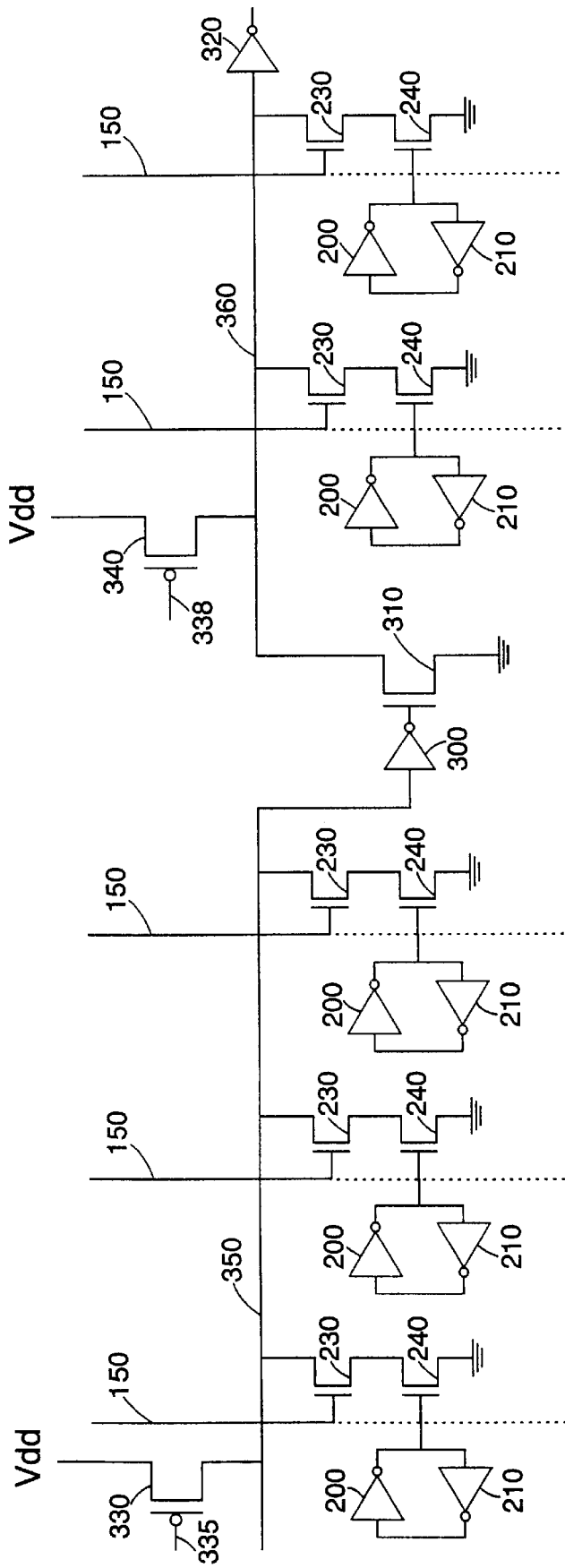
FIG. 3 illustrates the separation circuit used to partition a bit line in accordance with preferred embodiments of the present invention.

As shown in FIG. 3, the bit line 160 is separated in to two parts 350, 360 by separation logic, in preferred embodiments the separation logic consisting of an inverter 300 and an n-type transistor 310. Initially, the two parts 350, 360 of the bit line are precharged to a voltage Vdd via the p-type transistors 330 and 340, respectively. Hence, when the signals on the lines 335 and 338 are at a logic 0 level, then the first 360 and second 350 parts of the bit line are precharged.

In preferred embodiments, the source of the signal on the lines 335 and 338 is the same as the source of the signals on the word lines 150. Hence, whilst the p-type transistors 330 and 340 are turned on, and hence precharging the second 350 and first 360 parts of the bit line, respectively, the word lines 150 will have a logic 0 value and hence the first transistors 230 will be turned off.

When a register read process is to take place, the signal on the lines 335 and 338 will be changed to a logic 1 level so as to turn off the transistors 330 and 340. In addition, a logic 1 level signal will be provided to one of the word lines 150 associated with the register to be read. This will turn on the corresponding first transistor 230 thereby connecting the second transistor 240 to the bit line. If the memory cell 200, 210 is storing a logic 1 value, then the second transistor 240 will be turned on and so the bit line will be discharged.

If the word line to which the logic 1 level signal is provided is associated with a memory cell 200, 210 connected to the first part 360 of the bit line, then that memory cell will discharge the first part 360 of the bit line if it is storing a logic 1 value. In this instance, the second part 350 of the bit line will remain in the precharged (or logic 1) state, and hence the inverter 300 will output a logic 0 value to the gate of the n-type transistor 310, thereby ensuring that the n-type transistor is turned off.

When the first part 360 of the bit line is discharged, the inverter 320 will output a logic 1 value to indicate that the corresponding memory cell which has been read is storing a logic 1 value. In practice, the output of the inverter 320 will switch to a logic 1 value before the first part 360 of the bit line is fully discharged, and may for example switch when the voltage level on the first part 360 of the bit line drops below ⅓ Vdd.

Since the memory cell in this instance only has to discharge the first part 360 of the bit line, it will consume less power than if it had to discharge the entire bit line. Further, when the register read process is complete, and a logic 0 value is again passed to the gate of the p-type transistor 340, that transistor will consume less power to precharge the first part 360 of the bit line than it would need to consume if it was required to precharge the entire bit line.

If, during the register read process, a memory cell connected to the second part 350 of the bit line is activated by the word line 150, then the second part 350 of the bit line will be discharged if the memory cell is storing a logic 1 value. When the voltage level on the second part 350 of the bit line drops below a certain level, then the inverter 300 will output a logic 1 level signal to the gate of the n-type transistor 310, thereby turning that transistor on.

This will cause the first part 360 of the bit line to be discharged by the transistor 310, and hence this will cause the inverter 320 to output a logic 1 value to indicate that the memory cell is storing a logic 1 value. In preferred embodiments, the transistor 310 is chosen to be relatively large compared with the first and second transistors 230 and 240, and hence is able to discharge the first part 360 of the bit line relatively quickly. This ensures that the time taking to read a memory cell of a register in the second portion of the register bank is not adversely affected by the presence of the separation logic 300, 310.

Given that the power consumption required to precharge and discharge the first part of the bit line is less than that which would be required to precharge and discharge the entire bit line, then it will be appreciated that power savings are realised each time a memory cell in the first portion of the register bank is accessed. When a memory cell in the second portion of the register bank is accessed, then the memory cell will consume less power to discharge the second part 350 of the bit line than it would require to discharge the entire bit line, but additional power will be consumed to operate the separation logic 300, 310 to discharge the first part 360 of the bit line. However, overall, it will be appreciated that the arrangement illustrated in FIG. 3 enables significant power savings to be realised, particularly when the most frequently accessed registers are within the first portion of the register bank, and hence their memory cells are attached to the first part 360 of their associated bit line(s).

Figure 4:
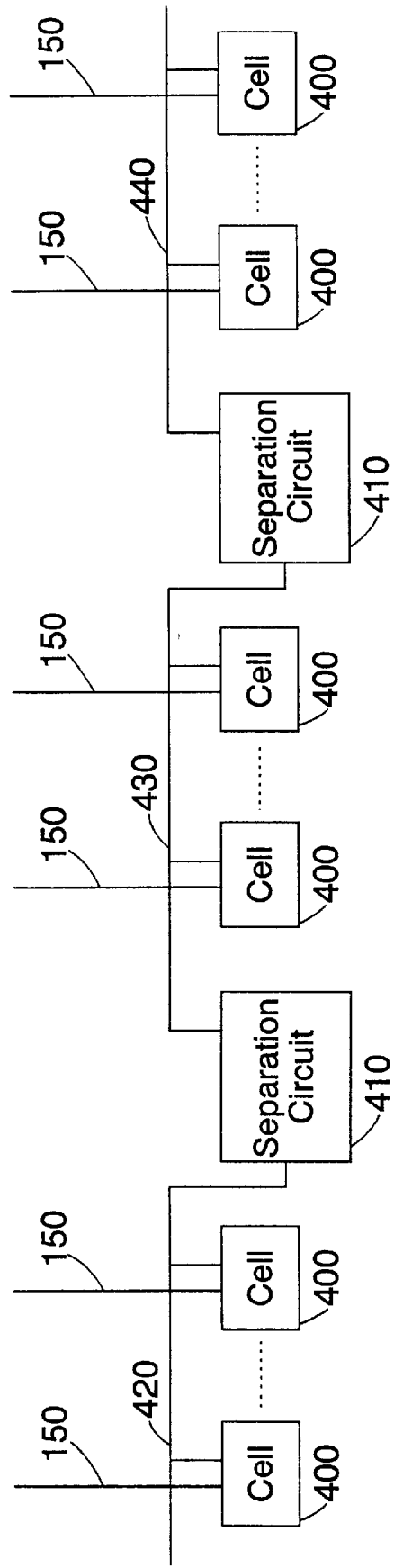
FIG. 4 illustrates how more than one separation circuit may be used to partition a bit line in to more than two parts in accordance with alternative embodiments of the present invention.

In the above description of the preferred embodiment, the register bank is divided into two portions, with one separation circuit being provided to separate each bit line into two parts, one corresponding to each register bank portion. However, as illustrated in FIG. 4, the register bank may be divided into more than two portions, to provide one or more intermediate power saving arrangements. Hence, as illustrated in FIG. 4, two separation circuits 410 may be provided to separate the bit line into first 440, second 430 and third 420 parts. In preferred embodiments, each separation circuit 410 has the structure of the separation logic 300, 310 shown in FIG. 3. Further, although two separation circuits are illustrated in FIG. 4, it will be apparent that any number of separation circuits could be provided as desired. The limit is one separation circuit per memory cell, but this would typically result in a slow register read speed and would hence limit the speed of a synchronous processor.

Figure 6:
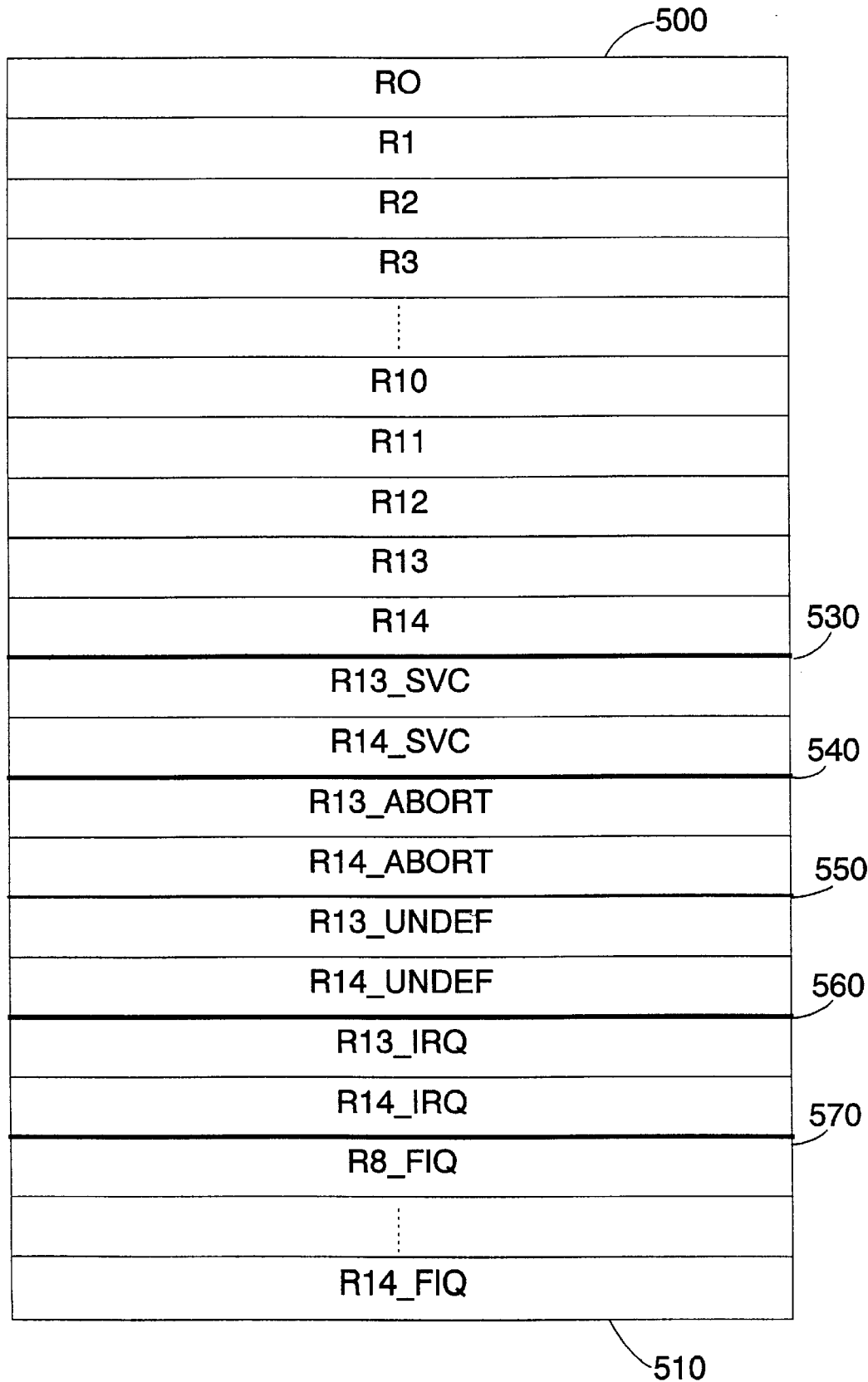
FIG. 6 illustrates how the registers shown in FIG. 5 are arranged within the register bank in accordance with preferred embodiments of the present invention.

A processor core can be arranged to operate in several different operating modes, and may use different registers in different operating modes. Hence, the position of the separation circuit(s) can be chosen dependent on the location of the registers used in one or more of the operating modes. For example, FIG. 5 illustrates the various registers used by an ARM processor core in six different operating modes. FIG. 6 illustrates the physical location of each register in the register bank in accordance with preferred embodiments of the present invention. Bit lines run through the register bank from the end 510 to the end 500 and the voltage on those bit lines is sensed at the end 500 of the register bank.

Since the ARM processor may spend most of its time in user mode, in preferred embodiments a separation circuit is used to separate the bit lines at the point 530 illustrated in FIG. 6, so that the registers R0 to R14 are located within the first portion of the register bank, and the other registers are located within the second portion of the register bank. However, if desired, one or more further separation circuits may be added at the points 540, 550, 560, 570 to provide further intermediate power saving arrangements when other modes of operation are being used.

Although a particular embodiment of the invention has been described herewith, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. A data processing apparatus, comprising:

a processor core for performing processing operations;

a register bank comprising a plurality of registers for storing data values used by the processor core, the register bank having first and second portions;

each register in the register bank comprising a plurality of memory cells for storing data bits, and the register bank having a bit line associated with corresponding memory cells from a number of said registers;

each memory cell being arranged, upon receipt of a command, to selectively alter the associated bit line from a first state to a second state dependent on the data bit stored in that memory cell;

a separation circuit being provided to separate the bit line into first and second parts, the first part being associated with memory cells of registers in the first portion of the register bank and being coupled to an output of the register bank, and the second part being associated with memory cells of registers in the second portion of the register bank;

the separation circuit being responsive to a memory cell of a register in the second portion of the register bank altering the second part of the bit line to said second state, to cause the first part of the bit line to be altered to said second state, whereas if a memory cell of a register in the first portion of the register bank alters the first part of the bit line to said second state, the separation circuit is arranged to maintain the second part of the bit line in the first state.

2. A data processing apparatus as claimed in claim 1, wherein the separation circuit is controlled directly by the state of the second part of the bit line.

3. A data processing apparatus as claimed in claim 1, wherein when a memory cell of a register in the second portion of the register bank is accessed, the separation circuit is arranged to receive a control signal to connect the first and second parts of the bit line.

4. A data processing apparatus as claimed in claim 1, wherein the first portion of the register bank is arranged to include the more frequently accessed registers.

5. A data processing apparatus as claimed in claim 1, wherein the processor core has a normal mode of operation and at least one other mode of operation, and the register bank is arranged such that registers arranged to store data values used only in said at least one other mode of operation are provided in the second portion.

6. A data processing apparatus as claimed in claim 1, wherein the separation logic includes an n-type transistor arranged to alter the state of the first part of the bit line to the second state in response to the second part of the bit line being altered to the second state.

7. A data processing apparatus as claimed in claim 6, wherein the source of the n-type transistor is connected to earth, and the drain of the n-type transistor is connected to the first part of the bit line.

8. A data processing apparatus as claimed in claim 6, wherein the separation logic further comprises an inverter having its input connected to the second part of the bit line, and its output connected to the gate of the n-type transistor.

9. A data processing apparatus as claimed in claim 1, wherein the first and second parts of the bit line each have a precharging circuit for precharging the bit line to the first state prior to the issuance of said command to a memory cell, the memory cell being arranged, upon receipt of said command, to selectively discharge the associated bit line from the first state to the second state dependent on the data bit stored in that memory cell.

10. A data processing apparatus as claimed in claim 9, wherein said precharging circuit comprises a transistor with its source connected to the bit line, and its drain connected to a reference voltage, whereby, upon receipt of a precharge signal at the gate of the transistor, the transistor is arranged to precharge the bit line to the first state.

11. A data processing apparatus as claimed in claim 10, wherein the precharge signal is only passed to the transistor when said command is not being passed to a memory cell associated with the bit line.

12. A data processing apparatus as claimed in claim 1, wherein the first part of the bit line is coupled to the output of the register bank via a sensing circuit, the sensing circuit being arranged to identify the occurrence of a memory cell discharging the bit line from the first state.

13. A data processing apparatus as claimed in claim 12, wherein the sensing circuit is an inverter which outputs a logic '0' value when the first part of the bit line is in the pre-charged state, but alters its output to a logic '1' level when the voltage on the first part of the bit line drops below a predetermined level during discharging of the bit line by an associated memory cell.

14. A data processing apparatus as claimed in claim 1, wherein said command is received by a memory cell via a word line, a word line being provided for each register, and being arranged to issue said command to each memory cell in that register, thereby causing each memory cell of that register to selectively alter the bit line associated with that memory cell from the first state to the second state dependent on the data bit stored in that memory cell, thereby providing an indication of the data value stored in that register.

15. A data processing apparatus as claimed in claim 1, wherein the register bank has one or more further portions, the data processing apparatus further comprising one or more further separation circuits to separate the bit line in to one or more further parts, such that each region of the register bank has an associated part of the bit line.

16. A method of operating a data processing circuit, comprising the steps of:

(a) performing processing operations;

(b) providing a register bank comprising a plurality of registers for storing data values used at said step (a), the register bank having first and second portions, each register in the register bank comprising a plurality of memory cells for storing data bits, and the register bank having a bit line associated with corresponding memory cells from a number of said registers;

(c) upon receipt of a command by a memory cell, causing that memory cell to selectively alter the associated bit line from a first state to a second state dependent on the data bit stored in that memory cell;

(d) providing a separation circuit to separate the bit line into first and second parts, the first part being associated with memory cells of registers in the first portion of the register bank and being coupled to an output of the register bank, and the second part being associated with memory cells of registers in the second portion of the register bank;

(e) responsive to a memory cell of a register in the second portion of the register bank altering the second part of the bit line to said second state, employing said separation circuit to cause the first part of the bit line to be altered to said second state; and (f) responsive to a memory cell of a register in the first portion of the register bank altering the first part of the bit line to said second state, employing said separation circuit to maintain the second part of the bit line in the first state.

* * * * *